United States Patent [19]
Heinen

[11] Patent Number: 6,111,272
[45] Date of Patent: Aug. 29, 2000

[54] SEMICONDUCTOR LIGHT SOURCE FORMED OF LAYER STACK WITH TOTAL THICKNESS OF 50 MICRONS

[75] Inventor: Jochen Heinen, Haar, Germany

[73] Assignee: Siemens Aktiengesellschaft, Munich, Germany

[21] Appl. No.: 09/162,689

[22] Filed: Sep. 28, 1998

[51] Int. Cl.[7] .................................................. H01L 33/00
[52] U.S. Cl. .............................. 257/94; 257/99; 372/46; 372/48
[58] Field of Search ................................. 257/99, 81, 91, 257/93, 95, 97, 94; 372/46, 48

[56] References Cited

U.S. PATENT DOCUMENTS

| | | | |
|---|---|---|---|
| 3,900,863 | 8/1975 | Kim . | |
| 5,344,517 | 9/1994 | Houlding | 156/236 |
| 5,502,316 | 3/1996 | Kish et al. . | |
| 5,578,162 | 11/1996 | D'Asaro et al. | 156/630.1 |
| 5,652,438 | 7/1997 | Sassa et al. | 257/94 |
| 5,705,834 | 1/1998 | Egalon et al. | 257/95 |

FOREIGN PATENT DOCUMENTS

| | | |
|---|---|---|
| 0 582 078 A1 | 2/1994 | European Pat. Off. . |
| 0 611 131 A1 | 8/1994 | European Pat. Off. . |
| 196 46 015 A1 | 6/1997 | Germany . |

*Primary Examiner*—Olik Chaudhuri
*Assistant Examiner*—Douglas A. Wille
*Attorney, Agent, or Firm*—Hill & Simpson

[57] ABSTRACT

A semiconductor light source with low photon absorption is not only structurally simple, but is also easy to produce. The light source is formed of a layer stack with a total thickness of 50 $\mu$m which is secured at a separate carrier body and connected to contacts of the carrier body with this thickness alone i.e. without intimate connection to a substrate, by a separate connecting structure. The diode is advantageous for realizing IREDs and LEDs of high optical performance.

4 Claims, 4 Drawing Sheets

SEMICONDUCTOR LIGHT SOURCE FORMED OF LAYER STACK WITH TOTAL THICKNESS OF 50 MICRONS

BACKGROUND OF THE INVENTION

Field of the Invention

The invention relates to a semiconductor light source with an epitaxially grown layer stack for generating photons and emitting photons and to a method for the production thereof.

Transparent infrared diodes (IREDs) and light emitting diodes (LEDs) are examples of light sources of this type. The layers of the layer stack of such light sources are grown epitaxially in succession on a growth substrate in the form of a crystal. Part of the photons generated in the layer stack are emitted from the stack in the direction of the growth substrate and are absorbed there.

For such semiconductor light sources of optimally high optical performance the attempt is made largely to avoid the absorption in the growth substrate. Besides the utilization of growth substrates that are transparent for the photons, which is possible in a few cases, Bragg reflectors formed of semiconductor material inserted between the growth substrate and the grown layer stack, or the postattachment of a supporting body to the layer stack where that body is transparent for the photons—e.g. by means of wafer bonds—are the means used for this.

In the postattachment of the transparent supporting body at the layer stack, the supporting body is connected in a planar and intimate fashion to the surface of the layer stack that is turned away from the growth substrate such that the supporting body is connected directly to the layer stack just as securely as the growth substrate itself. This direct attachment is carried out by casting the transparent supporting body to the layer stack. Subsequent to the attachment, the growth substrate is removed from the layer stack, whereupon the layer stack and the transparent supporting body are present together as a unified composite body similar to the previous layer stack and growth substrate and the transparent supporting body supports the layer stack now as the growth substrate did originally. In this condition the layer stack is electrically contacted or bonded.

SUMMARY OF THE INVENTION

It is an object of the invention to make available a semiconductor light source with low photon absorption which is not only simpler structurally, but also easier to produce.

In the semiconductor light source of the invention, there is advantageously neither a photon-absorptive growth substrate nor a supporting body for supporting the layer stack which is intimately connected to the layer stack in a unified composite body and is transparent for the photons generated in the layer stack. Such a body complicates the construction and the production of the light source.

The light source of the invention essentially is formed of only the layer stack with a low total thickness of at most 50 $\mu$m which is arranged at a separate carrier body for electrical contacting and mechanical stability and is connected to this body by means of a separate connecting structure requiring little expense. An intimate planar connection between the surface of this thin layer stack and a transparent supporting body, which complicates the production, is advantageously no longer necessary.

On the basis of the construction of the light source of the invention, a surface of the layer stack facing the carrier body can be a refractive surface which borders an optical medium—e.g. air—with a refractive index that is considerably smaller than a refractive index of the layer stack and which partially reflects photons generated in the layer stack on the basis of the relatively large jump in refractive index, these photons then contributing to the optical performance rather than going from the layer stack into the carrier body.

It is particularly advantageous if a reflector structure is constructed for reflecting the photons that are generated in the layer stack and incident at this surface back into the layer stack.

This has the advantage that, first, all the photons generated in the layer stack which impinge at the reflector structure do not go into the separate carrier body, but rather are reflected away from the carrier body and can contribute to the optical performance of the light source of the invention, and secondly, that the separate carrier body can be formed of an arbitrary material, even in light sources of high optical power, particularly of a material that absorbs the photons generated in the layer stack.

Any reflectively acting structure which can be constructed at the surface of the layer stack facing the carrier body is suitable as a reflector structure, such as a reflective layer deposited on this surface or a reflective optical grating such as a Bragg mirror fashioned in this surface, for example.

In a preferred and advantageous development of the light source of the invention, the reflector structure comprises a reflective contact arranged on the surface of the layer stack facing the carrier body. This contact can be used for electrical connection of the layer stack to the carrier body, and, since it acts to reflect, no additional reflectively acting structures are required. This simplifies the production of the light source of the invention.

The layer stack of the light source of the invention can advantageously bef formed only of the epitaxially grown layers that are necessary for the function of the semiconductor light source alone.

A typical total thickness of layer stacks of known diode light sources of particularly high optical performance such as IREDs and LEDs, which are grown on growth substrates and are formed only of the epitaxially grown layers that are necessary for the functioning of the light source alone lies in the range between 3 $\mu$m and 15 $\mu$m. Such diode light sources can be realized according to the invention in advantageous fashion with such thin layer stacks, and the single layer stack in the light source of the invention can correspondingly advantageously comprise a low total thickness in the range of only 3 $\mu$m to 15 $\mu$m.

Particularly, the invention is advantageously suitable for realizing IREDs and LEDs of high optical performance, and in this case the layer stack of the light source of the invention is the layer stack of an IRED or an LED, whereby it is additionally advantageous in this case to utilize a reflector structure.

The invention is not limited to such diode light sources; rather, it can be applied to other semiconductor light sources such as semiconductor lasers wherein the problem of an escape of the photons generated in the layer stack through the surface facing the carrier body can be potentially insignificant, so that measures to prevent such an escape from the outset can be forgone.

The separate connecting structure for the mutual fixation of layer stack and separate carrier body is preferably formed of a bonding agent producing a secure connection between the layer stack and this carrier body, preferably a glue and/or a solder.

Solder and/or electrically conductive glue are preferably utilized wherever an electrically conductive connection does not interfere or is even necessary; electrically insulating glue is used wherever an electrically conductive connection is to be avoided.

Other connecting structures can also be used, for example a clamping connection. A diode light source of the invention, particularly a source of high optical performance, can be advantageously constructed in structurally simple fashion such that the layer stack comprises layers formed of semiconductor material of different conductivity types relative to one another between which an optically active junction from one conductivity type to another is constructed for the generation of photons, and a semiconductor material of one conductivity type of the layer stack and semiconductor material of the other conductivity type are contacted at the carrier body in electrically separated fashion.

It is appropriate in this case if the carrier body comprises an electrical contact to which semiconductor material of one conductivity type of the layer stack is connected, and comprises another electrical contact to which semiconductor material of the other semiconductivity type of the layer stack is connected, this contact being separated from the one contact.

An electrical connection or terminal from semiconductor material of the layer stack of the light source of the invention to a contact of the carrier body is preferably connected to this contact of the carrier body by means of a semiconductor contact which directly contacts this semiconductor material.

The semiconductor contact is preferably a resistive contact, but can potentially be a Schottky contact also.

Solder and/or conductive glue is preferably utilized to connect a contact of the carrier body to a semiconductor contact.

In diode light sources the layers formed of semiconductor material of differing conductivity types between which the optically active junction from one conductivity type to the other, different type is fashioned are usually arranged over one another parallel to a plane of the layers, so that they are located on different sides of the junction perpendicular to this plane. Accordingly, in such a diode light source semiconductor material of one conductivity type must be contacted on one side of the junction, and semiconductor material of the other, different conductivity type must be contacted on the other side and connected to the electrically separated contacts of the carrier body.

Semiconductor material of one conductivity type of the layers tack of the light source of the invention and semiconductor material of the other, different conductivity type can however be advantageously connected on the same side of the junction while being connected in electrically separated fashion to the electrically separated contacts of the carrier body in such a case, if the layer stack comprises a depression in a surface that is essentially parallel to a plane of the layers, this depression extending from this surface in the perpendicular direction with respect to the layers through a junction from semiconductor material of one conductivity type of the layer stack to semiconductor material of another, different conductivity type, and if the semiconductor material of the one conductivity type is connected to a contact of the carrier body, and the semiconductor material of the other conductivity type is connected in the depression to another contact of the carrier body which is electrically separated from this first contact of the carrier body.

The layer stack is therein preferably arranged flat on the carrier body such that the surface of the layer stack in which the depression is fashioned faces the carrier body.

In this case, the connection of the semiconductor materials of different conductivity types of the layer stack to the separated contacts of the carrier body can be advantageously produced in particularly rapid fashion if the electrically separated contacts of the carrier body are arranged on a surface of the carrier body facing the layer stack, preferably as follows.

A semiconductor contact which directly contacts the semiconductor material of the stack located between this surface and the optically active junction and another contact which is separated from this semiconductor contact and from the semiconductor material between the surface and the optically active junction of the stack are arranged on the surface of the layer stack facing the carrier body.

The semiconductor contact of the layer stack is connected to a contact of the carrier body, and the other contact of the layer stack is connected to a contact of the carrier body that is electrically separated from this first contact of the carrier body, by means of direct touching, for example.

A semiconductor contact is arranged in the depression, this contact directly contacting semiconductor material of the layer stack which is located on the side of the optically active junction of the stack facing away from the carrier body. This semiconductor contact in the depression is electrically separated from semiconductor material of the one conductivity type on the side of the optically active junction facing the carrier body, from the semiconductor contact contacting this material, and from the contact of the carrier body connected to this terminal contact; on the other hand, it is electrically connected to the other contact of the layer stack.

This other contact of the layer stack that is connected to the semiconductor contact in the depression and an electrical connection of these two contacts can advantageously is formed of the same material as this semiconductor contact, whereby the connection can be placed on a sidewall of the depression.

It is preferably arranged so that the layer stack comprises two end faces which stand at an angle to the plane of the layers and which face away from each other—these faces bordering the surface of the layer stack in which the depression is fashioned on opposite sides, and that the depression extends in this surface from one end face to the other.

Semiconductor material of the layer stack located on the side of the optically active junction facing away from the carrier body preferably comprises a high electrical conductivity perpendicular to the plane of the layers of the layer stack.

The optical performance emitted by the light source of the invention is generated in the layer stack and escapes through the surface of the layer stack. All the photons generated in the layer stack should optimally contribute to this optical performance. For this purpose, it is necessary on the one hand that optimally few of these photons are absorbed in the stack i.e., the stack should be optimally transparent for these photons, and on the other hand, optimally many of these photons all, in the best case, should escape through the surface of the layer stack.

The greatest possible transparency of the layer stack is achieved if the layers of the layer stack are transparent for photons generated in the layer stack, except in a region of an optically active junction, as warranted.

To facilitate the escape of the photons generated in the layer stack therefrom, a means for facilitating an escape of the photons generated in the layer stack therefrom is appropriately provided.

Any means that promotes the escape of the photons through the surface of the layer stack is suitable as a means for facilitating the escape of photons. For example, such a means can be an antireflective layer deposited on the surface, this layer reducing the jump in the refractive index at the optically refractive surface from higher a refractive index inside the stack to a lower refractive index outside the stack, thus facilitating the escape of the photons.

Admittedly, the depositing of an additional reflective layer is often undesirable because the expense for and cost of the production of the light source grows to a not inconsiderable extent, for example.

One path to a simple realization of a means for facilitating the escape of photons consists in the avoidance of plane-parallel reflective surface portions of the layer stack; i.e., surface portions facing away from each other should not be even and/or parallel with respect to each other. Such surface portions can be realized merely by means of geometric shaping of the layer stack and thus without great expense.

Plane-parallel reflective surface portions can be avoided if the means for facilitating the escape of photons is designed such that it comprises surface portions arranged obliquely at an angle with respect to each other and/or comprises a relief designed on the surface of the layer stack, this relief being preferably finely structured.

Surface portions arranged obliquely at an angle can have two end faces which face away from each other and which stand at an angle to the plane of the layers, these end faces running obliquely at an angle to each other and/or at least one of these end faces being arranged obliquely at an angle to the plane.

A finely structured relief provided on the surface of the layer stack can be created by roughening the surface or by means of an uneven microstructuring of the surface. Such a relief is preferably provided on the surface of the layer stack facing away from the carrier body, but can also be provided on the surface thereof facing the carrier body, and on all other surface portions.

Surface portions of the layer stack arranged obliquely at an angle to the plane of the layers including one, several, or all of the end faces of the stack and/or at least one wall surface of a depression are preferably inclined to the plane at angles smaller than 30° in non-cast light sources of the invention and smaller than 40° in cast light sources of the invention, whereby the direction of the inclination is arbitrary.

Surface regions of the layer stack arranged at an angle to the plane of the layers can generally be arbitrarily shaped. The shape of the base or of the contour of the layer stack in vertical or perpendicular projection onto a plane parallel to the plane of the layers can also be generally arbitrarily selected.

The layer stack of the invention can advantageously comprise III-V semiconductor material in conventional fashion, including all common III-V compounds of In, GA, Al, As, P, N on the basis of GaAs, InP, GaP or GaN.

An optically active junction can be a pn or pin junction. The layer stack of the invention can be advantageously designed in conventional fashion such that the optically active junction comprises an active layer arranged between two layers of the layer stack that are formed of semiconductor material of different conductivity types, photons being potentially generated in this active layer. Except for the active layer, all other layers of the layer stack formed of semiconductor material are optimally transparent.

The carrier body advantageously is formed of a material that comprises a thermal coefficient of expansion similar to that of the layer stack, i.e., at the temperatures which arise in the operation of the semiconductor light source of the invention or to which the source is exposed, the thermal coefficient of expansion of the materials of the carrier body and of the layer stack deviate from one another if need be so slightly that harmful temperature-conditioned deformations of the layer stack which can compromise its optical quality and the optical and/or mechanical long-term stability of the light source of the invention do not arise.

The carrier body preferably is formed of a material with good thermal conductivity, which guarantees a good heat abstraction from the layer stack.

Silicon is a material that is highly suitable for the carrier body, this having a thermal coefficient of expansion which matches that of the layer stack well and comprising a good thermal conductivity.

The electrical connection of the light source of the invention from outside occurs via the electrically separated contacts of the carrier body, e.g. by means of bond wires and/or solder. If the carrier body is formed of electrically conductive material, two advantageous variations can be distinguished:

a1) Electrically separated contacts of the carrier body are formed of contacts that are insulated from the electrically conductive surface of the carrier body, or a2) One contact is appropriately a contact that is insulated from the electrically conductive surface of the carrier body, and another contact that is electrically separated from this contact is formed by the surface of the carrier body itself.

In each of these cases, the contacts are advantageously arranged on a surface of the carrier body facing the layer stack, whereby a particularly short and simple connection of the semiconductor materials of different conductivity types of the layer stack on both sides of the stack's optically active junction to these contacts results if these materials are contacted on the surface of the stack facing the carrier body, because the contacts on the surface of the carrier body and semiconductor contacts on the surface of the layer stack facing this surface that contact these semiconductor materials can then lie in direct opposition and can touch.

In case a2 it can be advantageous if the electrical connection of the light source of the invention from outside via the electrically separated contacts on the carrier body is constructed such that, on the one hand, the electrically insulated contact of the carrier body, and on the other, the contact thereof formed by the surface of the carrier body itself, are contacted indirectly from the outside through the electrically conductive carrier body such that a surface of the carrier body facing away from the layer stack is contacted.

The light source of the invention is preferably and advantageously produced such that the layer stack determined for the light source is grown epitaxially on a growth substrate. The layer stack connected to the growth substrate is arranged on the carrier body comprising the electrically separated contacts and is secured and electrically contacted with the connecting structure. The layer sequence thus secured on the carrier body is subsequently separated from the growth substrate.

With respect to the separation of the layer stack from the growth substrate, this method is preferably carried out such that an intermediate layer is epitaxially grown on the growth substrate from a material that can be etched with a selectively acting etching agent which does not attack the materials of the layers of the layer stack or attacks these less strongly than the material of the intermediate layer. The layers of the layer stack are grown epitaxially on the intermediate layer. To separate the layer stack from the growth substrate the intermediate layer is etched with the selectively acting etching agent. This method can be performed with a growth substrate formed of GaAs, a layer stack based on InGaAlAs, an intermediate layer formed of AlAs, and an etching agent containing hydrofluoric acid.

The production of the semiconductor light sources of the invention preferably occurs such that a plurality of layer stacks are prepared in the wafer compound as islands or mesas in the grid of a plurality of carrier bodies, whereby the shape of the base of each layer stack is arbitrarily selectable, and preferably with sides arranged at acute angles with respect to one another.

BRIEF DESCRIPTION OF THE INVENTION

DESCRIPTION OF THE PREFERRED EMBODIMENTS

Figure 1:
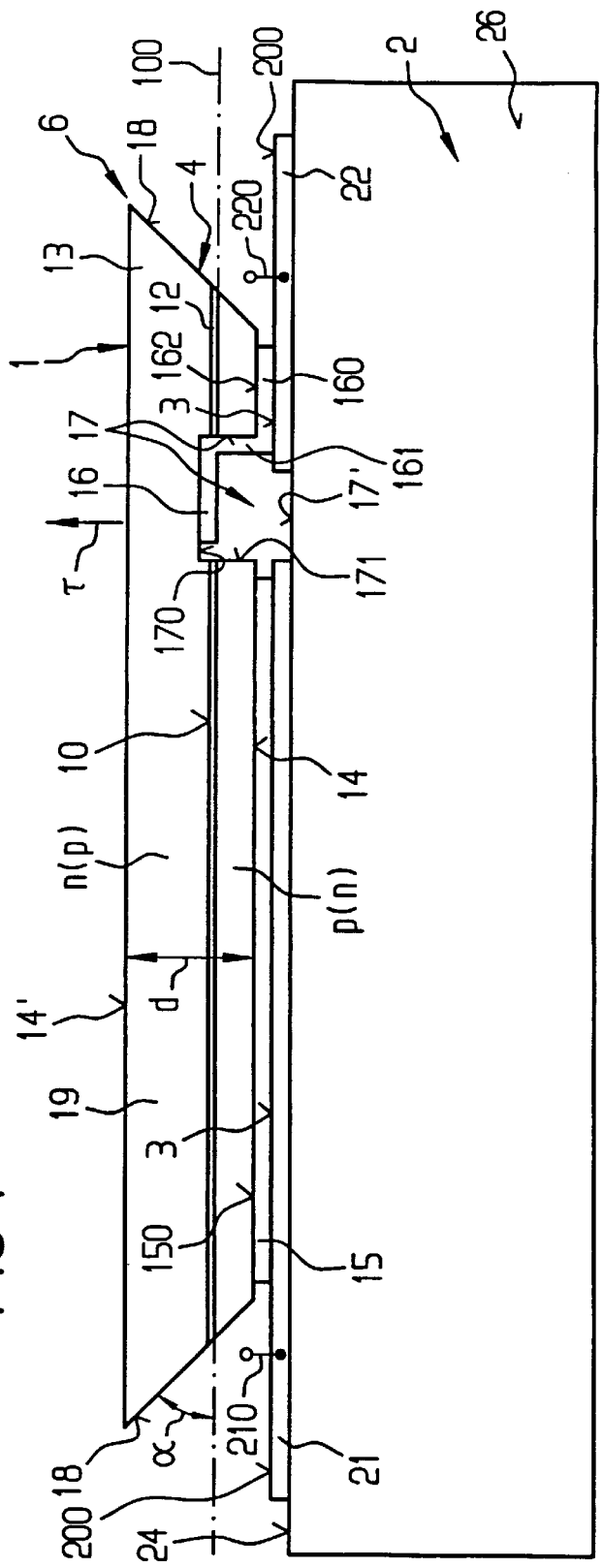
FIG. 1 is a side view of an exemplary embodiment of a semiconductor light source of the invention.

In the drawing Figures, the layer stack is referenced 1 and the carrier body 2. The layers of the layer stack 1 are arranged parallel to a defined plane 100 of the layers. The layer stack 1 comprises two surfaces 14 and 14' facing away from each other between which the total thickness d of the stack 1 is measured.

It is essential to the invention that the layer stack 1 alone, i.e. without a growth substrate and/or some other supporting body that is intimately connected to the stack 1 is arranged with the total thickness d of 50 μm at the most at the separate carrier body 2 comprising electrically separated contacts 21 and 22, and that layer stack 1 and carrier body 2 are secured to one another by means of a separate connecting structure 3.

The layer stack 1 can comprise any structure of layers which are epitaxially grown in succession and which can have a semiconductor light source.

In the exemplary embodiments depicted, the semiconductor light source is a diode light source, in particular, wherein the layer stack 1 is formed of layers of semiconductor material of different conductivity types which are epitaxially grown in succession at least one optically active junction from one conductivity type to the other being designed between these layers and generating photons whereby semiconductor material of one conductivity type of the layer stack 1 and semiconductor material of the other type are electrically contacted in separated fashion.

A typical total thickness d of a layer stack 1 of conventional diode light sources lies in the range between 3 μm and 15 μm. In a diode light source of the invention, the layer stack 1 arranged only at the separate carrier body 2 advantageously comprises a total thickness d in the range from 3 μm to 15 μm as well.

In the light source of the invention, as in conventional diode light sources, at least one active layer of the layer stack 1 is typically allocated to the optically active junction, photons of this junction being generated therein.

In the diode light sources depicted in the drawing Figures, the simplest shape of a layer stack 1 is assumed. This is formed of a layer 11 of semiconductor material of one conductivity type, a layer 13 of semiconductor material of the other conductivity type, and an active layer 12 for generating photons, this being arranged between layer 11 and layer 13.

A central layer plane or level of the active layer 12 is taken as plane 100 of the layers 11, 12, and 13 arranged parallel to one another.

Figure 2:
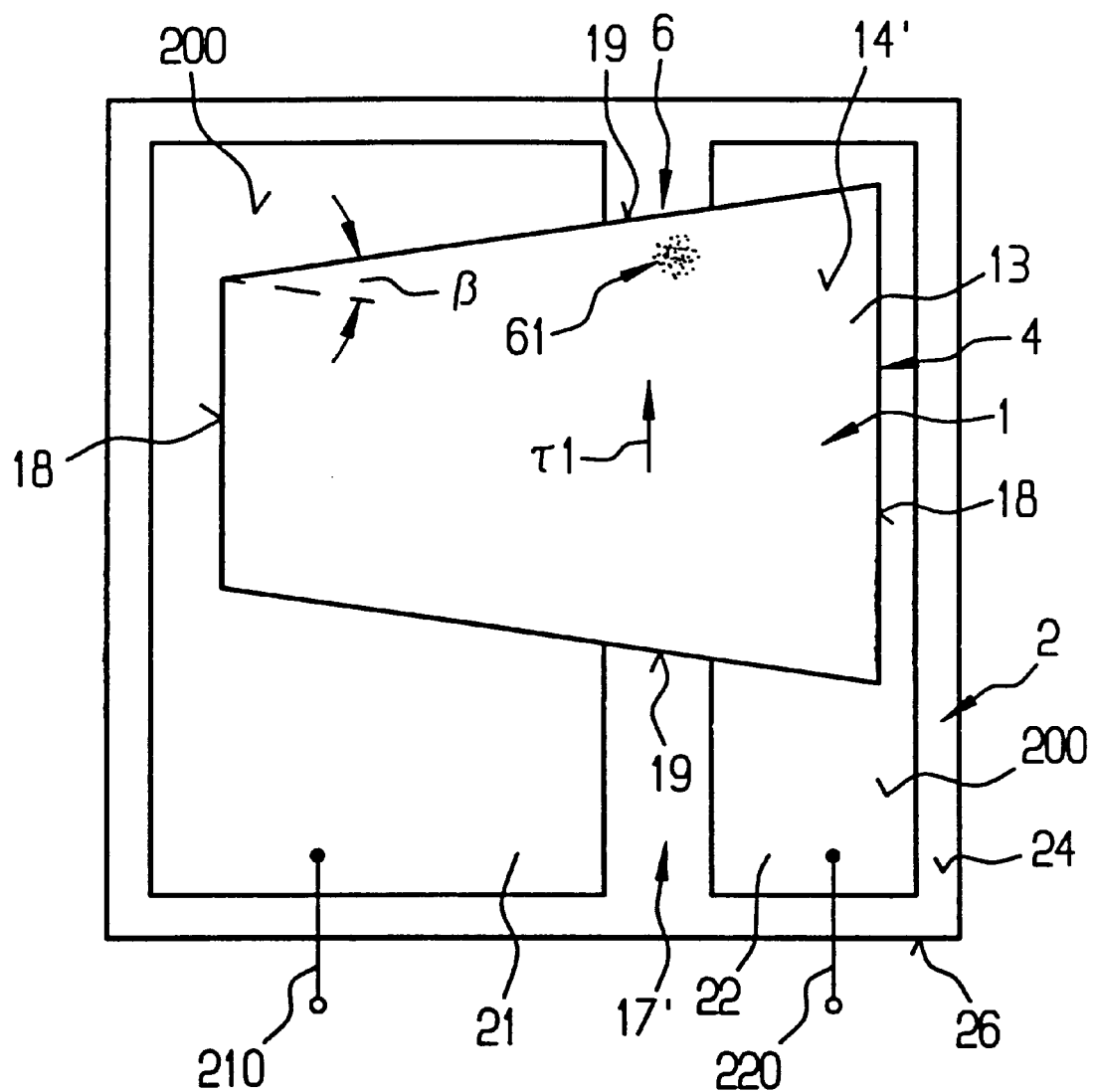
FIG. 2 is a plan view of the embodiment according to FIG. 1.
Figure 3:
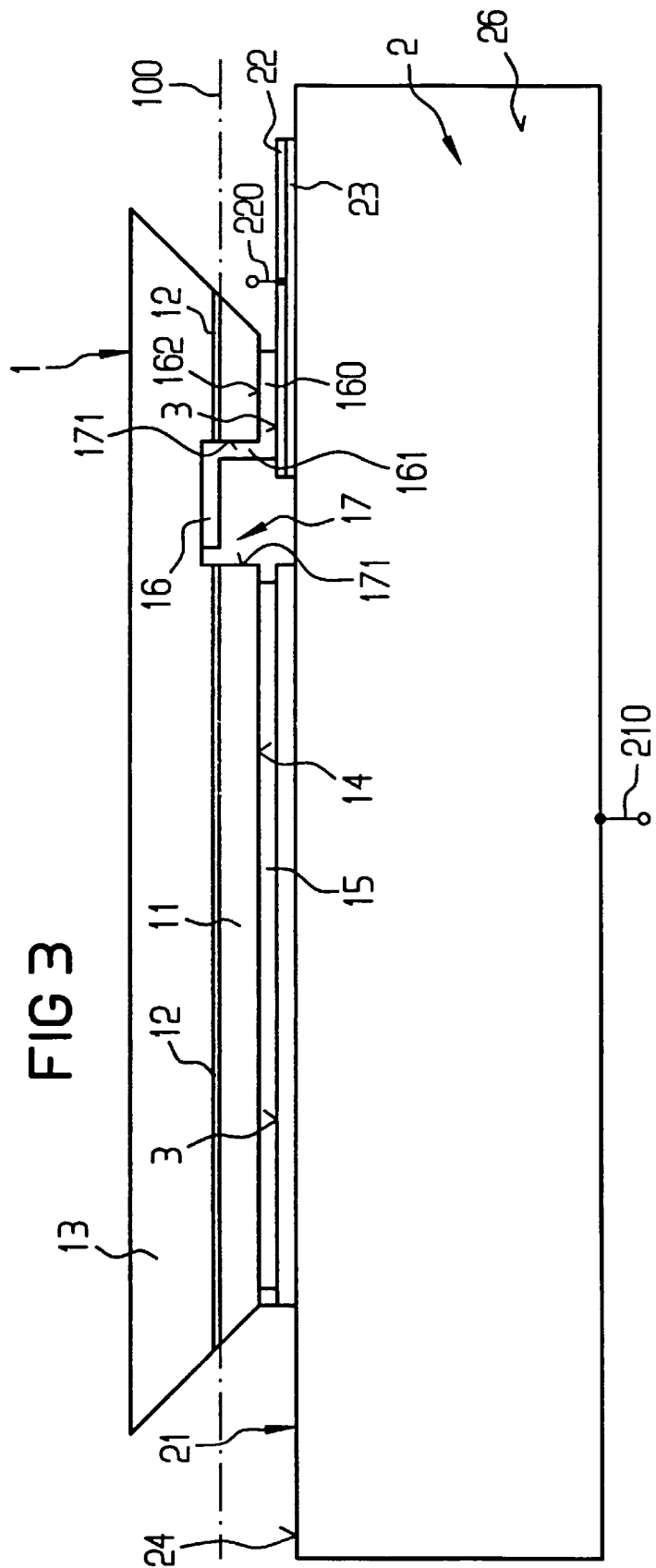
FIG. 3 is a modification of the exemplary embodiment according to FIGS. 1 and 2 in the side view according to FIG. 1.
Figure 4:
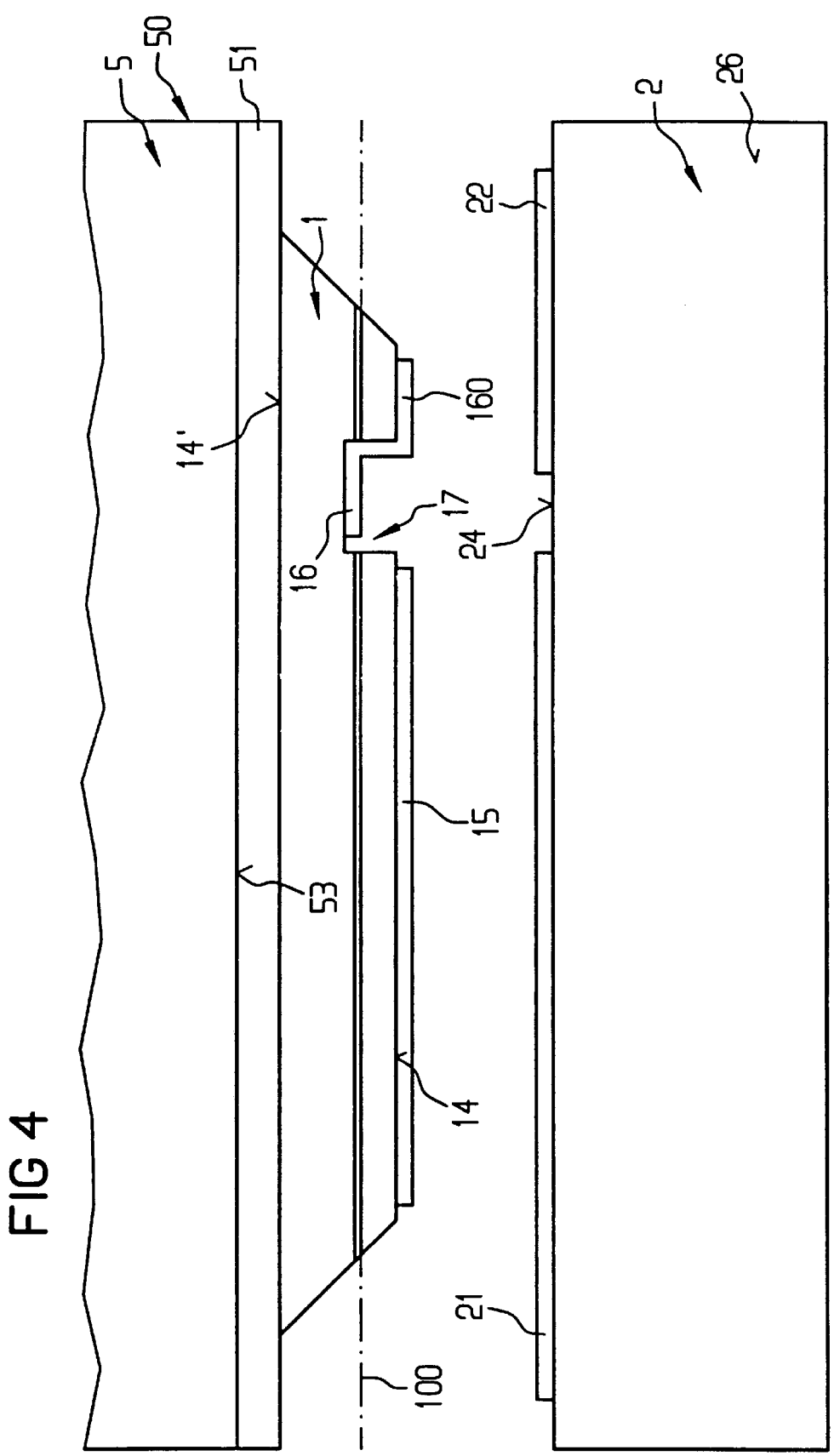
FIG. 4 shows the layer stack and carrier body of the exemplary embodiment according to FIGS. 1 and 2 in the side view according to FIG. 1, where the layer stack is still intimately connected to the growth substrate and is not yet secured on the carrier body.

The layer stack 1 is depicted in the FIGS. 1, 3, and 4 such that the plane 100 of the layers is arranged horizontally and perpendicularly to the plane of projection, and in FIG. 2 parallel to the plane of projection.

The optically active junction that generates photons and referenced 10 is located between the layer 11 and the layer 13, and extends parallel to the plane 100 of the layers. The active layer 12 belongs to the junction 10.

The number of epitaxially grown layers of the layer stack 1 is not limited to three and can be larger. For example, the layers 11, 12 and 13 can be laminated, respectively.

The semiconductor material of the layers 11 and 13 of the layer stack 1 are selected such that it is transparent for photons generated in the active layer 12 arranged between these layers 11 and 13.

In the depicted examples, carrier body 2 and layer stack 1 are arranged in relation to one another such that a surface 24 of the carrier body 2—which faces the stack 1—and the plane 100 of the layers of the stack 1 are essentially parallel to each other. Of the two surfaces 14 and 14' of the carrier body 2 which face away from each other, the surface 14 resides opposite the surface 24 of the carrier body 2.

In the example according to the FIGS. 1, 2 and 4, the electrically separated contacts 21 and 22 of the carrier body 2 are metallic layers which are arranged between the essentially parallel opposing surfaces 14 and 24 of the layer stack 1 and carrier body 2, these layers being secured on the surface 24 of the carrier body 2.

If the carrier body 2 is formed of electrically conductive material such as metal, then the contacts 21 and 22 need to be insulated from the surface 24. In any case, they must be securely connected to the surface 24 e.g. by means of glue or vacuum metallizing or vapor depositing.

The layer stack 1 is arranged such that the layer 11 is located between the carrier body 2 and the optically active junction 10, whereby the surface 14 of the layer stack 1 that opposes the surface 24 of the carrier body 2 is formed of the semiconductor material of this layer 11.

A semiconductor 15 which directly contacts the semiconductor material of the layer 11 of the stack 1 and another contact 160 which is electrically separated from the semiconductor contact 15 and from the semiconductor material of the layer 11 are arranged on this surface 14 of the layer stack 1. The semiconductor contact 15 is preferably a resistive contact, but it could also be a Schottky contact, for example, according to the construction of the layer stack 1.

The semiconductor contact 15 rests directly on the contact 21 of the carrier body 2, and the other contact 160 rests directly on the contact 22. The reverse is also possible.

A depression 17 is provided in the surface of the stack 1 which extends from this surface 14 in direction T perpendicularly to the plane 100 of the layers into the depth of the layer stack 1 into the layer 13, i.e., not into the semiconductor material of the other conductivity type, which is different from a conductivity type of the semiconductor material of the layer 11 and which is located on the side of the optically active junction 10 facing away from this surface 14, unlike the semiconductor material of the layer 11 located between the surface 14 and the junction 10 of the stack 1.

A semiconductor contact 16 is arranged in the depression 17 which directly contacts the semiconductor material of the other conductivity type of the layer 13, e.g. on a base 170 of the depression 17, and which is preferably a resistive contact. This semiconductor contact 16 is electrically connected to the other contact 160 by means of an electrical connecting line 161, for example.

The semiconductor contact 16, the electrical connecting line 161, and the other contact 160 must be electrically separated from the semiconductor material of the layer 11, the semiconductor terminal contact 15 that contacts this material, and the contact 21 of the carrier body 2.

The other contact 160 and the electrical connecting line 161 can advantageously be provided of the same material as the semiconductor contact 16. The electrical connecting line 161 can be installed on one of the lateral wall faces 171 of the depression 17.

The electrical separation of the other contact 160 and the connecting line 161 from the semiconductor material of the layer 11 of the stack 1 can be realized by an electrically insulating glue layer 162 between the layer 11 and the other contact 160 as well as the connecting line 161. This glue layer also produces the secure connection of the other contact 160 to the layer stack.

In the depicted examples, the layer 11 is formed of p-doped semiconductor material —i.e. material of conductivity type p, and the layer 13 is formed of n-doped semiconductor material, for example material of conductivity type n. The reverse is also possible; i.e., the layer 11 is formed of n-doped semiconductor material, and the layer 13, of p-doped material.

In any case the semiconductor material of the layer 13 on the side of the junction 10 of the layer stack 1 facing away from the carrier body 2 should have a higher electrical conductivity perpendicular to the plane 100 of the layers than the semiconductor material of the layer 11 between the junction 10 and the carrier body 2.

The separate connecting structure 3 for securing the thin layer stack 1 at the carrier body 2 essentially is formed of an electrically conductive glue and/or a solder which securely connects the semiconductor contact 15 of the layer stack 1 which is connected to the layer 11 to the allocated contact 21 of the carrier body 2, and which securely connects the other contact 160 of the stack 1 which is likewise connected securely to the layer 11 to the allocated contact 22 of the carrier body 2. This preferred mode of production of a secure contact between layer stack 1 and carrier body 2 via contacts is preconditioned by the given secure connection of the semiconductor contact 15 and other contact 160 to the layer stack 1, and of the contacts 21 and 22 to the carrier body 2.

The securing of the layer stack 1 to the carrier body 2 need not be produced via contacts. For example, the mutually opposing surfaces 14 and 24 of the stack 1 and carrier body 2 could be directly connected to each other in secure fashion at contactless locations by a connecting structure 3, e.g. a suitable glue.

The layer stack 1 comprises two end faces 19 which face away from each other and which stand perpendicularly or obliquely at an angle to the plane 100 of the layers. These faces border the surfaces 14 of the layer stack 1 in which the depression 17 is formed on mutually opposing sides. The depression 17 extends in this surface 14 transversely over the entire layer stack 1 from one of these two end faces 19 to the other end face 19.

For example, the depression 17 forms a longitudinal trench extending between the end faces 19 parallel to the plane 100 of the layers in a longitudinal direction r1 which is perpendicular to the plane of projection in the FIGS. 1, 3 and 4. These Figures show a side face 26 of the carrier body 2 which is perpendicular to the surface 24 and parallel to the plane of projection as well as the end faces 19 of the layer stack 1 which are respectively arranged at the bottom in FIG. 2.

In the exemplary embodiment according to the FIGS. 1, 2 and 4, the depression 17 is preferably arranged across a gap 17' between the separated contacts 21 and 22 of the carrier body 2 so that these contacts 21 and 22 of the layer stack 1, and the contacts 15 and 160, accordingly are located on opposite sides of the depression 17. In the case of the depression 17 in the form of the trench extending in the direction r1, this gap 17 likewise extends in this direction r1.

A reflector structure 4 fashioned on the surface 14 of the layer stack 1 facing the carrier body 2 for reflecting photons generated in the layer stack 1 and incident on this surface 4 back into the layer stack is formed of the semiconductor material 15, for example, which is fashioned on the surface 14 of the layer stack 1 facing the carrier body 2 and which acts to reflect; i.e., the face side 150 thereof which faces the layer stack 1 is a reflective surface. This contact 15 should cover the surface 14 of the layer stack 1 facing the carrier body 2 over an optimally great area, so that an optimally large number of photons are reflected and an optimally small number are lost.

A structure 6 for facilitating an escape of photons generated in the layer stack 1 therefrom comprises surface portions which are arranged obliquely at an angle with respect to one another, these portions being formed of end faces 18, 18 of the layer stack 1 that are arranged at an angle α to the plane of the layers 100, lateral wall faces 171, 171 of the depression 17 which are arranged perpendicular to the plane 100 of the layers, and end faces 19, 19 of the layer stack 1 which are arranged obliquely or perpendicularly to the plane 100 of the layers and which run obliquely in the plane 100 of the layers at an angle β. These portions respectively forming two surface portions which are arranged obliquely at an angle relative to one another and are allocated to one other in pairs, respectively.

This is only one specific example, however; the end faces 18, 18, 19, 19 and wall surfaces 171, 171 can be arranged obliquely at an angle to each other any other way. In any case, two surface portions, end faces and/or wall faces, which face away from each other should stand obliquely at an angle to each other. This is guaranteed if at least one of two surface portions which face away from each other is arranged obliquely at an angle to the plane 100 of the layers, and the other is arranged obliquely or perpendicularly to this plane at a different angle, and/or these two surface portions run obliquely in the plane 100 of the layers at an angle to each other.

In addition, the structure 6 for facilitating the escape of photons comprises a finely structured relief 61 provided on the surface of the layer stack 1.

The surface of the layer stack 1 means its whole surface, which is formed of the surface 14 that faces the carrier body 2, the surface 14' that faces away from the carrier body 2, and all the other surface portions 18, 19, 170, 171. The relief 61 can be formed on any of these surface portions 18, 19, 170, 171, but should be provided at least on the surface 14' that faces away from the carrier body 2, as fragmentarily indicated in FIG. 2.

The angle α at which an end face 18, 19 is arranged obliquely with respect to the plane 100 of the layers is preferably less than 30° in non-cast light sources of the invention, and less than 40° in cast light sources of the invention, whereby the direction of the inclination is arbitrary. A wall face 171 of the depression 17 can be obliquely arranged in inclined fashion at such an angle α to the plane 100 of the layers.

If the layer stack 1 is formed of III-V semiconductor material, and the carrier body 2 is formed of silicon, then the two have a sufficiently similar thermal coefficient of expansion, and the carrier body 2 is sufficiently thermally conductive.

The carrier body 2 can is formed of electrically insulating material, e.g. undoped or semi-insulating semiconductor material such as silicon, or of electrically conductive material such as conductive semiconductor material like silicon or metal, for example.

In the case of the exemplifying embodiment according to FIGS. 1, 2 and 4, in a conductive carrier body 2 all the electrically separated contacts 21 and 22 of the carrier body 2 must be electrically insulated therefrom.

FIG. 3 depicts a modified exemplifying embodiment with a carrier body 2 formed of electrically conductive material, this embodiment differing from the example according to FIGS. 1, 2 and 4 in that one of the contacts 21 and 22 of the carrier body— e.g. the contact 22—is electrically insulated from the carrier body 2, and the other contact 21, which is electrically separated from this contact 22, is formed by the material of the carrier body 2 itself. In FIG. 3, parts which match parts of the exemplifying embodiment according to FIGS. 1 and 2 are referenced with the same characters.

In the example according to FIG. 3, the contact 22 of the carrier body 2 is insulated from the surface 24 of the carrier body 2 by an electrically insulating layer 23 such as a glue layer and is connected to the other contact 160 of the layer stack 1 by means of an electrically conductive connecting structure 3, e.g. solder or electrically conductive glue. The contact 21 of the carrier body 2 is formed by its surface 24 itself and is connected directly to the semiconductor contact 15 of the layer stack 1 by an electrically conductive connecting structure 3, e.g. solder or electrically conductive glue.

Unlike in the example according to the FIGS. 1, 2 and 4 wherein each of the electrically separated contacts 21 and 22 of the carrier body 2 on the surface 24 thereof facing the layer stack 1 is provided with a respective outer terminal contact 210 or 220, such as a bond wire, in the example according to FIG. 3 the contact 22 on the surface 24 which is electrically separated from the carrier body 2 is provided with an outer terminal contact 220, and a surface 25 of the carrier body 2 that faces away from this surface 24 and thus from the layer stack 1 is provided with an outer terminal contact 210, so that in this case the semiconductor light source is contacted by the back side of the carrier body 2 and through this body from the outside.

The production of the semiconductor source of the invention occurs with reference to FIG. 4 such that the layer stack 1 determined for the light source is epitaxially grown on a growth substrate 5, the layer stack 1 connected to the growth substrate 5 is arranged on the carrier body 2 comprising the electrically separated contacts 21, 22 and is secured with the connecting structure 3, and the layer stack 1 thus secured on the carrier body 2 is subsequently separated from the growth substrate 5.

Accordingly, the surface 14 of the layer stack 1 facing the carrier body 2 is the free surface of the layer stack 1 that faces away from the growth substrate 5, this surface being structured and contacted, e.g. provided with the depression 17 and the contacts 15, 16 and 160 including the connecting line 161 prior to the separation of the layer stack 1 from the growth substrate 5.

FIG. 4 assumes a carrier body 2 according to the FIGS. 1 and 2; a carrier body 2 according to FIG. 3 could be used just as well.

The layer stack 1 is appropriately separated from the growth substrate 5 in that prior to the epitaxial growing of the layers of the layer stack I on the growth substrate 5, an intermediate layer 51 is grown from a material that can be selectively etched with an etching agent that does not attack the material of any layer of the layer stack 1 to be epitaxially grown any of the layers 11, 12 or 13 in the example, or attacks this material less strongly than the material of the intermediate layer 51, so that the layers of the layer stack 1 are grown epitaxially on the intermediate layer 51. To separate the layer stack 1 from the growth substrate 5 the intermediate layer 51 is etched with the selectively acting etching agent.

For example, a growth substrate 5 formed of GaAs, a layer stack 1 on the basis of InGaAlAs, an intermediate layer 51 formed of AlAs, and an etching agent containing hydrofluoric acid are utilized.

The production of the semiconductor light sources of the invention is advantageously carried out in that a plurality of layer stacks 1 are prepared in the wafer compound as islands or mesas 50 in the grid of a plurality of carrier bodies 2, whereby the shape of the base of each layer stack 1 is arbitrarily selectable, preferably with lateral end faces 19 arranged at acute angles to each other. FIG. 4 depicts an individual island 50 which rises from the base 52 of a wafer (shown fragmentarily) forming the growth substrate 5 as a whole. The intermediate layer 51 is arranged on the raised surface 53 of the island or of the mesa 50.

The mesas or islands 50 are preferably formed in that the intermediate layer 51 and the layers of the layer stack 1 are epitaxially grown on the surface of the wafer in entirely flat fashion, and the islands 50 are subsequently etched from the layered surface.

Although various minor modifications might be suggested by those skilled in the art, it should be understood that my wish to embody within the scope of the patent warranted hereon all such modifications as reasonably and properly come with the scope of my contribution to the art.

I claim as my invention:

1. A semiconductor light source for generating photons and emitting photons, comprising:
  a layer stack formed of a first conductivity type semiconductor layer followed by an optically active junction, which is turn followed by a semiconductor layer of second conductivity type;
  a carrier body having first and second electrical contacts thereon, the first electrical contact supporting the second conductivity type semiconductor layer via a separate connecting structure which is separate from the second conductivity type semiconductor layer;
  a depression extending upwardly through the second conductivity type semiconductor layer, through the optically active junction, and into a portion of the first conductivity type semiconductor layer;

a contact having a first portion at a top of the depression in contact with said first conductivity type semiconductor layer and having a portion extending downwardly out of the depression to a portion which lies on top of said first electrical contact on said carrier body, said contact being insulated from and not contacting said second conductivity type semiconductor layer supported by the first electrical contact; and said layer stack formed of said first and second semiconductor layers and optical active layer having a total thickness of 50 $\mu$m at most.

2. The light source according to claim 1 wherein the second electrical contact on the carrier body comprises an electrical contact followed by an electrical insulating layer lying on top of the carrier body.

3. The light source according to claim 1 wherein said connecting structure for securing the layer of stack at the carrier body is formed of an electrically conductive glue.

4. The light source according to claim 1 wherein said separate connecting structure for securing the layer stack at the carrier body is formed of a solder which securely connects the first contact on the carrier body, which is a semiconductor contact, to the second conductivity type layer of the layer stack.

* * * * *

UNITED STATES PATENT AND TRADEMARK OFFICE
CERTIFICATE OF CORRECTION

PATENT NO. : 6,111,272
DATED : August 29, 2000
INVENTOR(S) : Jochen Heinen

It is certified that error appears in the above-identified patent and that said Letters Patent is hereby corrected as shown below:

<u>Title page,</u>
Below item [22], add item [30] -- Foreign Application Priority Data --
and below that add -- September 29, 1997 (DE) . . . . . . . . . . 19742963.7 --.

Signed and Sealed this

Second Day of July, 2002

*Attest:*

JAMES E. ROGAN
*Attesting Officer*   *Director of the United States Patent and Trademark Office*